United States Patent
Shu et al.

(10) Patent No.: US 10,249,496 B2
(45) Date of Patent: Apr. 2, 2019

(54) NARROWED FEATURE FORMATION DURING A DOUBLE PATTERNING PROCESS

(71) Applicant: GLOBALFOUNDRIES Inc., Grand Cayman (KY)

(72) Inventors: Jiehui Shu, Clifton Park, NY (US); Xusheng Yu, Ballston Lake, NY (US); John H. Zhang, Altamont, NY (US); Xiaoqiang Zhang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/587,597

(22) Filed: May 5, 2017

(65) Prior Publication Data
US 2018/0323067 A1 Nov. 8, 2018

(51) Int. Cl.
*H01L 21/033* (2006.01)
*H01L 23/525* (2006.01)
*H01L 23/532* (2006.01)
*H01L 21/311* (2006.01)

(52) U.S. Cl.
CPC .... *H01L 21/0337* (2013.01); *H01L 21/31116* (2013.01); *H01L 23/5252* (2013.01); *H01L 23/53214* (2013.01); *H01L 23/53228* (2013.01)

(58) Field of Classification Search
CPC .................................................. H01L 21/0337
USPC ............................................................ 257/529
See application file for complete search history.

(56) References Cited

U.S. PATENT DOCUMENTS

| | | | |
|---|---|---|---|
| 9,177,797 B2 | 11/2015 | Chang et al. | |
| 2015/0056800 A1* | 2/2015 | Mebarki | H01L 21/76885 438/652 |
| 2015/0214070 A1* | 7/2015 | deVilliers | H01L 21/32133 438/697 |
| 2016/0190065 A1* | 6/2016 | Liaw | H01L 23/5283 257/751 |

* cited by examiner

*Primary Examiner* — Jami Valentine Miller
(74) *Attorney, Agent, or Firm* — Thompson Hine LLP; Anthony Canale

(57) ABSTRACT

Interconnect structures and methods of fabricating an interconnect structure. A first mandrel line, a second mandrel line, and a non-mandrel line between the first mandrel line and the second mandrel line are provided. A first sidewall spacer is formed adjacent to a section of the first mandrel line and is arranged between the section of the first mandrel line and the non-mandrel line. A first cut is formed that extends partially across the non-mandrel line adjacent to the first spacer to narrow a section of the non-mandrel line. The section of the first mandrel line is removed selective to the first sidewall spacer to form a second cut. An interconnect is formed using the non-mandrel line. The interconnect includes a narrowed section coinciding with a location of the narrowed section of the non-mandrel line.

11 Claims, 4 Drawing Sheets

NARROWED FEATURE FORMATION DURING A DOUBLE PATTERNING PROCESS

BACKGROUND

The present invention relates to integrated circuits and semiconductor device fabrication and, more specifically, to interconnect structures and methods of fabricating an interconnect structure.

A back-end-of-line (BEOL) interconnect structure may be used to connect device structures fabricated on a substrate during front-end-of-line (FEOL) processing with each other and with the environment external to the chip. Self-aligned patterning processes used to form a BEOL interconnect structure involve mandrels as sacrificial features that establish a feature pitch. Sidewall spacers, which have a smaller thickness than permitted by the current ground rules for optical lithography, are formed adjacent to the vertical sidewalls of the mandrels. After selective removal of the mandrels, the sidewall spacers are used as an etch mask to etch an underlying hardmask, for example, with a directional reactive ion etch (ME) process. Unmasked features in the pattern are transferred from the hardmask to a dielectric layer to define trenches in which the wires of the BEOL interconnect structure are formed.

Cuts may be formed in mandrels with a cut mask and etching in order to section the mandrels and define gaps that may be subsequently used to produce wires that are spaced apart at their tips with a tip-to-tip spacing. A pattern reflecting the cut mandrels may be transferred to the hardmask and subsequently from the hardmask to the patterned interlayer dielectric layer. Non-mandrel cuts may also be formed in the hardmask itself and define gaps that may be filled by dielectric material when the sidewall spacers are formed. The filled gaps may be subsequently used to produce wires in the patterned interlayer dielectric layer that are spaced apart at their tips with a tip-to-tip spacing.

Electrical fuses may include an anode, a cathode, and a fuse link connecting the anode and cathode. Electrical fuses define closed circuits at the time of fabrication. Electrical fuses may be dynamically programmed in real time by passing an electrical current of relatively high current density through the fuse link. Generally, the electrical resistance of the programmed electrical fuse is larger and, in most instances, significantly larger than the electrical resistance of the intact electrical fuse. Among other uses, electrical fuses may be programmed to replace defective circuit elements with redundant circuit elements or may be programmed to alter circuit connections.

Improved interconnect structures and methods of fabricating an interconnect structure are needed.

SUMMARY

In an embodiment of the invention, an interconnect structure includes a first interconnect having a first width and a first cut extending through the first interconnect across the first width. The interconnect structure further includes a second interconnect having a first section with the first width and a second cut extending partially through the second interconnect across a second section of the second interconnect. The second section of the second interconnect has a second width that is less than the first width.

In an embodiment of the invention, a method is provided for forming metallization in an interconnect structure. A first mandrel line, a second mandrel line, and a non-mandrel line between the first mandrel line and the second mandrel line are provided. A first sidewall spacer is formed adjacent to a section of the first mandrel line and is arranged between the section of the first mandrel line and the non-mandrel line. A first cut is formed that extends partially across the non-mandrel line adjacent to the first spacer to narrow a section of the non-mandrel line. The section of the first mandrel line is removed selective to the first sidewall spacer to form a second cut. An interconnect is formed using the non-mandrel line. The interconnect includes a narrowed section coinciding with a location of the narrowed section of the non-mandrel line.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 3A is a top view of the structure at the fabrication stage of FIG. 3 and in which FIG. 3 is taken generally along line 3-3.

FIG. 6A is a top view of the structure at the fabrication stage of FIG. 6 and in which FIG. 6 is taken generally along line 6-6.

FIG. 7A is a top view of the structure at the fabrication stage of FIG. 7 and in which FIG. 7 is taken generally along line 7-7.

FIG. 8A is a top view of the structure at the fabrication stage of FIG. 8 and in which FIG. 8 is taken generally along line 8-8.

DETAILED DESCRIPTION

Figure 1:
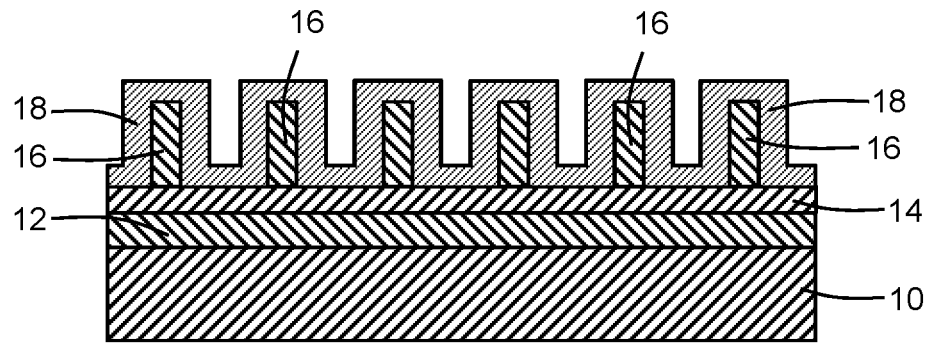
FIGS. 1-8 are respective cross-sectional views of a structure at successive fabrication stages of a processing method in accordance with embodiments of the invention.

With reference to FIG. 1 and in accordance with embodiments of the invention, an interlayer dielectric layer 10 may be comprised of an electrically-insulating dielectric material, such as hydrogen-enriched silicon oxycarbide (SiCOH) or another type of low-k dielectric material. The interlayer dielectric layer 10 may be located on a substrate that includes device structures fabricated by front-end-of-line (FEOL) processing to form an integrated circuit.

A hardmask layer 12 is located on the top surface of the interlayer dielectric layer 10. The hardmask layer 12 may be comprised of a metal, such as titanium nitride (TiN), deposited by physical vapor deposition (PVD). The hardmask layer 12 is removable from the interlayer dielectric layer 10 selective to the material of the interlayer dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

A dielectric hardmask layer 14 is formed on the hardmask layer 12. The dielectric hardmask layer 14 may be comprised of a dielectric material, such as silicon nitride ($Si_3N_4$), deposited by chemical vapor deposition (CVD). In an alternative embodiment, the dielectric hardmask layer 14 may be comprised of a different dielectric material, such as silicon dioxide ($SiO_2$). The material constituting the dielectric hardmask layer 14 is chosen to be removable from the hardmask layer 12 selective to the material of the hardmask layer 12.

Mandrels 16 are formed on a top surface of the dielectric hardmask layer 14. The mandrels 16 may be concurrently formed by depositing a blanket layer of a sacrificial material on the entire top surface of the dielectric hardmask layer 14 and patterning the blanket layer by lithography and etching using a lithography stack. For example, a sidewall image transfer (SIT) process or a self-aligned double patterning (SADP) process may be used to pattern the mandrels 16.

A conformal layer 18 comprised of a dielectric material may be deposited using, for example, atomic layer deposition (ALD). The material constituting the conformal layer 18 may be chosen so as to be removed by a given etch chemistry selective to the material of the mandrels 16. For example, the choice of the dielectric material constituting the conformal layer 18 may be silicon dioxide ($SiO_2$), and the choice of the sacrificial material constituting the mandrels 16 may be silicon, which may be removed selective to silicon dioxide so that the mandrels 16 can be pulled without removing sidewalls spacers formed, as described hereinbelow, using the conformal layer 18.

Figure 2:
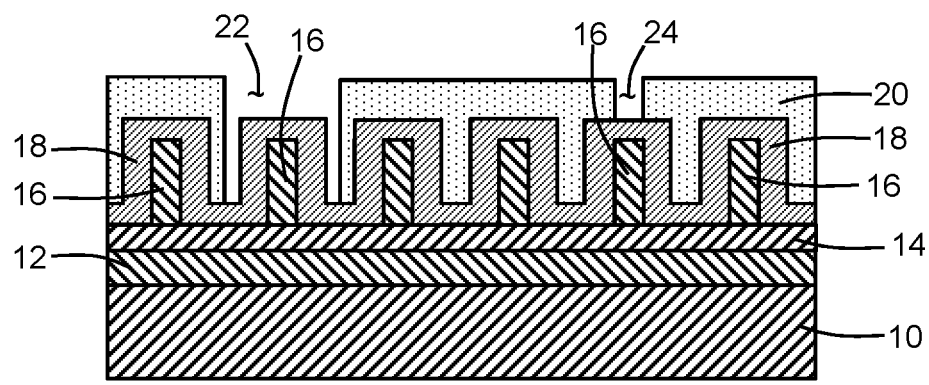

With reference to FIG. 2 in which like reference numerals refer to like features in FIG. 1 and at a subsequent fabrication stage of the processing method, a lithography stack 20 is applied on the conformal layer 18 and patterned to define openings 22, 24 of a cut mask. The openings 22, 24 are aligned with different areas over the underlying mandrels 16 and conformal layer 18. The lithography stack 20 may include, for example, an organic planarization layer, an anti-reflective coating, and a layer of photoresist. The opening 24 exposes an area that is used to perform a mandrel cut in the underlying mandrel 16.

The opening 22 in the lithography stack 20 is dimensionally larger in size than opening 24. The opening 22 exposes an area that is used to perform a mandrel cut removing a section of the mandrel 16 exposed by the opening 22, as well as a non-mandrel cut removing sections of the dielectric hardmask layer 14.

Figure 3:
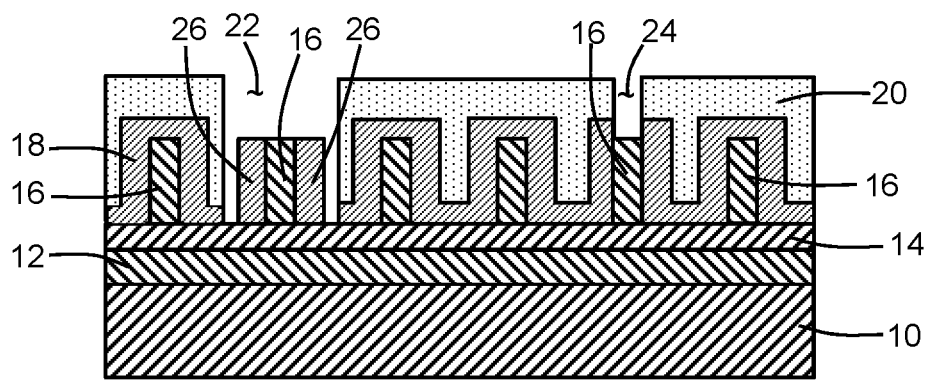
Figure 3A:
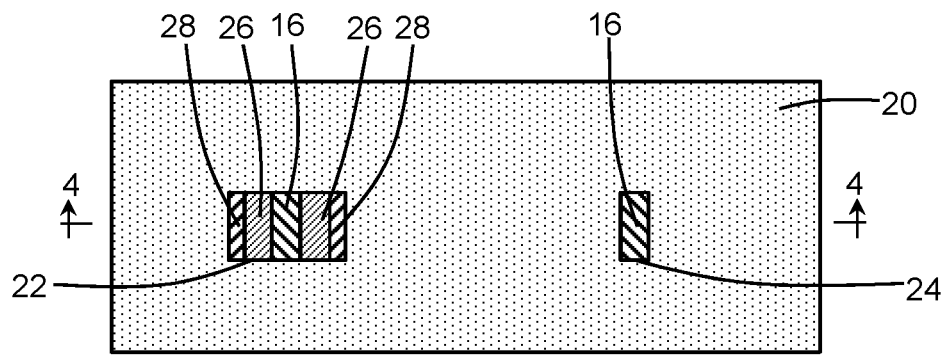

With reference to FIGS. 3, 3A in which like reference numerals refer to like features in FIG. 2 and at a subsequent fabrication stage of the processing method, sidewall spacers 26 are formed on the top surface of the dielectric hardmask layer 14 adjacent to the vertical sidewalls of the mandrel 16 over the area exposed by the opening 22 in the lithography stack 20. Sections of the conformal layer 18 on the top surface of the mandrels 16 in the areas exposed by each of the openings 22, 24 are removed by the etching process. The sidewall spacers 26 may be formed inside the opening 22 by shaping the conformal layer 18 with an anisotropic etching process, such as reactive ion etching (RIE). The anisotropic etching process preferentially removes the conformal layer 18 from horizontal surfaces in deference to the dielectric material adjacent to the sidewalls of the mandrel 16 exposed by the opening 22.

The etching process also concurrently removes sections of the conformal layer 18 adjacent to the sidewall spacers 26 so as to expose areas 28 on the top surface of the dielectric hardmask layer 14 that are adjacent to the sidewall spacers 26. The conformal layer 18 is masked by the lithography stack 20 outside of the openings 22, 24. These removed sections of the conformal layer 18 subsequently lead to the introduction of notches that narrow wires formed using non-mandrel lines that are overlapped by the areas 28.

Figure 4:
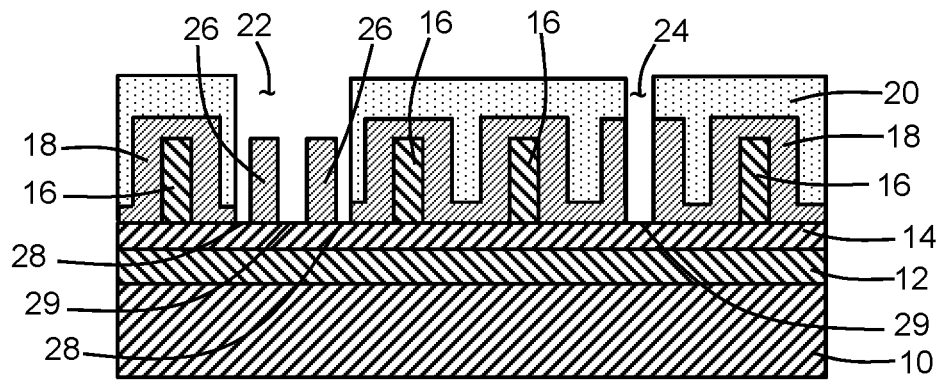

With reference to FIG. 4 in which like reference numerals refer to like features in FIGS. 3, 3A and at a subsequent fabrication stage of the processing method, sections of the mandrels 16 exposed by the openings 22, 24 in the lithography stack 20 are removed by an etching process having a suitable etch chemistry may be used to remove the sections of the mandrels 16 selective to the sidewall spacers 26 and dielectric hardmask layer 14. Areas 29 on the top surface of the dielectric hardmask layer 14 are revealed, and the involved mandrels 16 are discontinuous when these sections of the mandrels 16 are pulled to create mandrel cuts.

Figure 5:
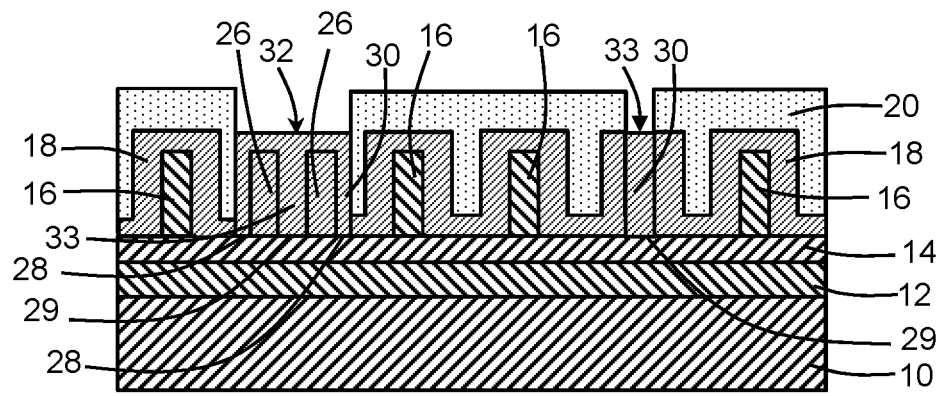

With reference to FIG. 5 in which like reference numerals refer to like features in FIG. 4 and at a subsequent fabrication stage of the processing method, a sacrificial layer 30 may be formed by spin-coating and etch-back to fill the open space above the areas 28, 29. The sacrificial layer 30 may be comprised of, for example, a spin-on glass (SOG) that is applied and subject to a heat treatment to form a silicon oxide. In an embodiment, the sacrificial layer 30 and the sidewall spacers 26 may be composed of the same material. The sacrificial layer 30 may be etched back to be, for example, co-planar with the sections of the conformal layer 18 on top of the remaining mandrels 16.

A block mask 32 is formed inside of the opening 22 in the lithography stack 20. The block mask 32 includes the sidewall spacers 26 and a section of the sacrificial layer 30 that fills the open space over the area 29 between the sidewall spacers 26 that was formerly occupied by the section of the mandrel 16 removed using opening 22. The block mask 32 further includes sections of the sacrificial layer 30 that fill the open spaces over the areas 28 between the sidewall spacers 26 and the lithography stack 20 bordering the opening 22. The area of the block mask 32 projects a footprint on the dielectric hardmask layer 14 that is equal to the area of the opening 22 in the lithography stack 20. The block mask 32 eventually contributes to the formation of cut wires with a mandrel cut at the location of the removed mandrel section and wires with sections of narrowed width at the location of the areas 28 between the sidewall spacers 26 and the lithography stack 20 bordering the opening 22. In the latter regard, the narrowed wire sections are provided by the sections of the sacrificial layer 30 that fill the open spaces over areas 28 between the sidewall spacers 26 and the lithography stack 20 bordering the opening 22. Another block mask 33 is formed by a section of the sacrificial layer 30 that fills the space over the area 29 that was formerly occupied by the section of the mandrel 16 removed using opening 24.

Figure 6:
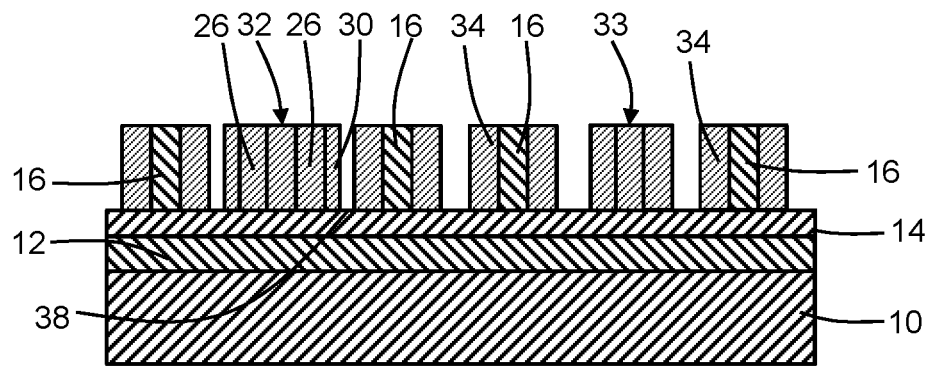
Figure 6A:
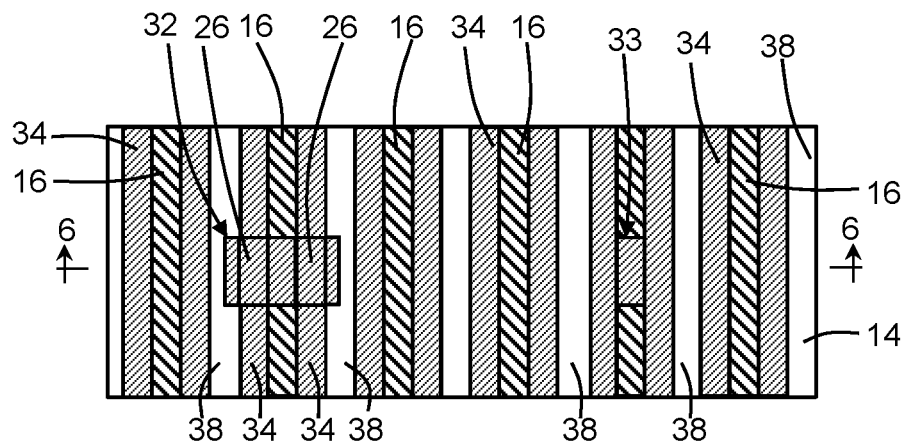

With reference to FIGS. 6, 6A in which like reference numerals refer to like features in FIG. 5 and at a subsequent fabrication stage of the processing method, the lithography stack 20 is stripped, and sidewall spacers 34 are formed on the top surface of the dielectric hardmask layer 14 adjacent to the vertical sidewalls of the mandrels 16. The sidewall spacers 34 may be formed by subjecting the conformal layer 18 to an anisotropic etching process, such as reactive ion etching (RIE). The anisotropic etching process preferentially removes the dielectric material from horizontal surfaces, such as the sections of conformal layer 18 on the top surfaces of the dielectric hardmask layer 14 and the mandrels 16 in deference to the dielectric material adjacent to the sidewalls of the mandrels 16. Sidewall spacers 26, where present as components of the block mask 32 and previously formed in connection with the block mask 32, are aligned with the sidewall spacers 34 and are continuous with the sidewall spacers 34.

Non-mandrel lines 38 of the dielectric hardmask layer 14 are arranged between the adjacent pairs of the sidewall spacers 26 as areas of the dielectric hardmask layer 14 that are not covered by the mandrels 16, sidewall spacers 26, and sidewall spacers 34. The block mask 32 overlaps at one of its side edges with a portion of an adjacent non-mandrel line 38 to define a notch that changes the width of the overlapped non-mandrel line 38 over the area of overlap. The block mask 32 overlaps at the other of its side edges with a portion of a different adjacent non-mandrel line 38 to also define a notch that changes the width of this overlapped non-mandrel line 38 over the area of overlap. The portions of these overlapped non-mandrel lines 38 masked by the block mask 32 will eventually form width-changing notches in notched wires formed using these particular non-mandrel lines 38.

Figure 7:
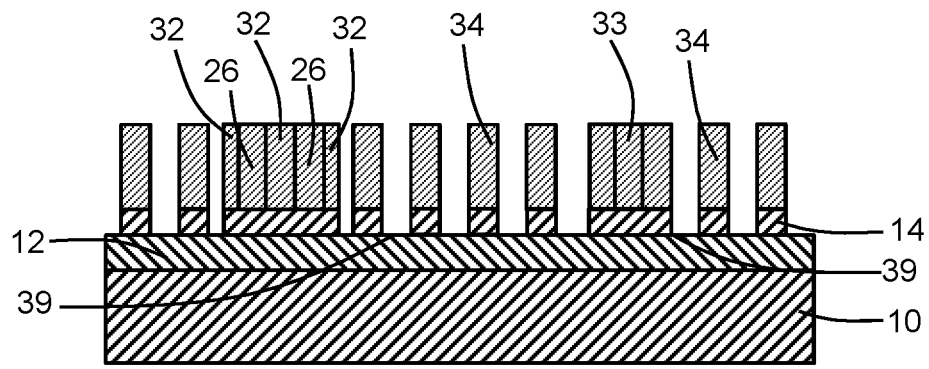
Figure 7A:
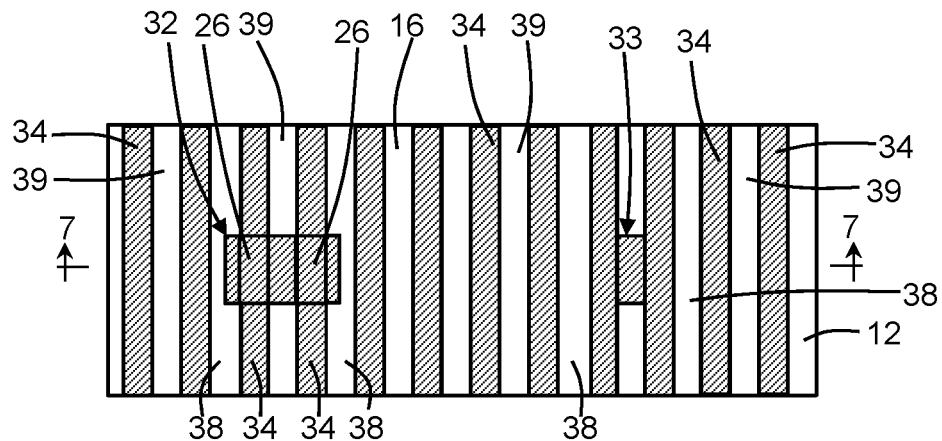

With reference to FIGS. 7, 7A in which like reference numerals refer to like features in FIGS. 6, 6A and at a subsequent fabrication stage of the processing method, the mandrels 16 are pulled from their respective positions between the sidewall spacers 34 using an etching process that is selective to the materials of the sidewall spacers 26, 34, the sacrificial layer 30 in the block masks 32, 33, and the dielectric hardmask layer 14. Mandrel lines 39 are revealed on the top surface of the dielectric hardmask layer 14 when the mandrels 16 are pulled. The non-mandrel lines 38 and mandrel lines 39 have an interdigitated arrangement, and are located in the gaps between adjacent pairs of sidewall spacers 34. Some of the non-mandrel lines 38 have a narrowed width between the side edges of the block mask 32.

The dielectric hardmask layer 14 is subsequently patterned by an etching process with the sidewall spacers 26 and the block masks 32, 33 operating as an etch mask. The dielectric hardmask layer 14 is removed during patterning over the areas exposed by the non-mandrel lines 38 and mandrel lines 39.

The hardmask layer 12 is subsequently patterned by an etching process with the patterned dielectric hardmask layer 14 operating as an etch mask to transfer the non-mandrel lines 38 and mandrel lines 39 to the hardmask layer 12. The dielectric hardmask layer 14, sidewall spacers 34, and block masks 32, 33 may be removed after the hardmask layer 12 is patterned.

Figure 8:
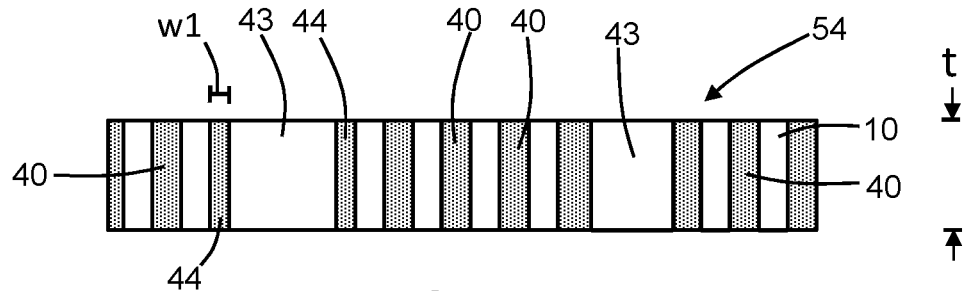
Figure 8A:
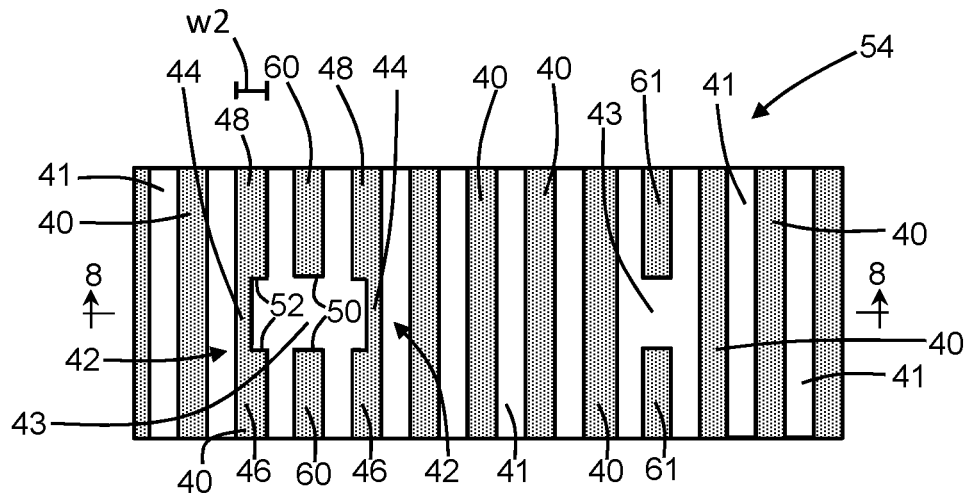

With reference to FIGS. 8, 8A in which like reference numerals refer to like features in FIGS. 7, 7A and at a subsequent fabrication stage of the processing method, the interlayer dielectric layer 10 is etched using the hardmask layer 12 as a patterned etch mask to form trenches in the interlayer dielectric layer 10. After the interlayer dielectric layer 10 is etched, the hardmask layer 12 may be selectively removed by an etching or cleaning process. The trenches in the interlayer dielectric layer 10 are then filled with a conductor to form wires 40, 60, 61 as interconnects of a metallization level of an interconnect structure 54. A liner (not shown) comprised of titanium (Ti), titanium nitride (TiN), tantalum (Ta), tantalum nitride (TaN), or a layered combination of these materials (e.g., a bilayer of Ti/TiN) may be applied to the trenches before filling with the metal. The wires 40, 60, 61 may be comprised of a low-resistivity conductor, such as copper (Cu), aluminum (Al), or cobalt (Co).

The shapes and geometries of the wires 40, 60, 61 reproduce the shapes and geometries of the non-mandrel lines 38 and mandrel lines 39 in the hardmask layer 12 transferred as trenches to the interlayer dielectric layer 10. Adjacent pairs of wires 40, 60, 61 are separated from each other in one lateral direction by respective strips 41 of the electrical insulator constituting the interlayer dielectric layer 10. The strips 41 correspond in location to the spaces between adjacent pairs of non-mandrel lines 38 and mandrel lines 39. The wires 60 have a tip-to-tip spacing separating their respective tips or end surfaces 50 arising from the associated mandrel cut performed using the opening 22 in the lithography stack 20. The wires 61 likewise have respective end surfaces with a tip-to-tip spacing arising from the associated mandrel cut performed using the opening 24 in the lithography stack 20.

Electrical fuses 42 are structures formed in the metallization level of the interconnect structure 54. Each of the electrical fuses 42 includes a fuse link 44 defined by a narrowed section of one of the wires 40 in which the narrowed section has a width w1. Adjacent wider sections of the same wire 40, which have a width w2, respectively define an electrode 46 and an electrode 48 of each electrical fuse 42. A portion of an end surface 52 of the electrode 48 is connected with a portion of an end surface 52 of the electrode 46 by the fuse link 44. The electrodes 46, 48 represent an anode and cathode of each electrical fuse 42.

In an embodiment, the width w1 of the narrowed sections of wires 40 may be in a range of less than or equal to 50 percent of the width w2 of the wide sections of wires 40 to greater than or equal to 25 percent of the width w2 of the wide sections of wires 40. In a numerical example, the narrowed sections of wires 40 (i.e., the fuse links 44) may have a width in a range of five (5) nanometers to ten (10) nanometers and the wide sections of wires 40 (i.e., the electrodes 46, 48) may have a width equal to twenty (20) nanometers. The fuse link 44 and electrodes 46, 48 of each electrical fuse 42 (which are respective sections of the same wire 40) have the same thickness, t, as wires 40 that lack the electrical fuses 42. The wires 40, 60, 61 that lack the electrical fuses 42 also have the width w2.

A section 43 of the interlayer dielectric layer 10 is laterally arranged between the fuse links 44 of the different electrical fuses 42. The localized narrowing of the sections of the wires 40 providing the fuse links 44 occurs at the former location of the opening 22 in the lithography stack 20 used to define the area of the block mask 32. The masked and preserved area of the hardmask layer 12 and dielectric hardmask layer 14 at the location of the block mask 32 is transferred over an equal area to the section 43 of the interlayer dielectric layer 10. The section 43 of the interlayer dielectric layer 10 produces the notches that locally narrow the width of the sections of wires 40 to produce the fuse links 44, and manifests the cut that produces the cut wires 60. Another section 43 of the interlayer dielectric layer 10 is located between the ends of the cut wires 61.

The end surfaces 52 of the electrodes 46, 48 and the end surfaces 50 of the cut wires 60 are also separated by the section 43 of the interlayer dielectric layer 10 at the former location of the block mask 32. The end surface 50 of one of the cut wires 60 is aligned in the same plane as the end surface 52 of the electrode 46, and the end surface 50 of the other of the cut wires 60 is aligned in the same plane as the end surface 52 of the electrode 48. The fuse links 44 of the electrical fuses 42 have a length measured as a distance from the end surface 52 of one electrode 46 to the end surface 52 of the other electrode 48. As a result of the sharing of the block mask 32 to form both the fuse links 44 and the cut wires 60, the end-to-end distance between the end surfaces 50 of the cut wires 60 is equal to the length of the fuse links 44.

The fuse link 44 and electrodes 46, 48 of the electrical fuses 42 are located in a single metallization level, which contrasts with conventional BEOL fuses that position the electrodes and fuse link with a vertical arrangement in three different metallization levels.

The electrical fuses 42 may be programmed by applying a bias potential between the electrode 46 and electrode 48. The identity of electrodes 46, 48 as the anode and cathode is contingent upon the polarity of the bias potential applied to the electrical fuses 42 during programming. The bias potential may be applied in a pulse train or as a single pulse of a lengthier duration. The bias potential can be controlled through the size (i.e., cross-sectional area and length) of the fuse link 44, which is determined by the size of the cut mask. Electrical current of relatively high density flows through the fuse link 44 due to the smaller cross-sectional area of the fuse link 44 in comparison with the electrodes 46, 48. As electrical current flows through the fuse link 44, the temperature of the fuse link 44 is elevated by Joule heating. The elevated temperature combined with the high current density promotes electromigration of the conductive material of the fuse link 44. The result is that the fuse link 44 physically changes from a low resistance state, when intact and prior to programming, to a high resistance state after programming.

Although described herein in connection with the formation of an electrical fuse, a person having ordinary skill in the art will appreciate that the notched wires forming the electrical fuses may have other applications in double patterning processes, such as self-aligned double patterning (SADP) and self-aligned quadruple patterning (SAQP) processes.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interconnect structure comprising:
a first interconnect having a first width and a cut extending through the first interconnect across the first width; and
a second interconnect having a first section with the first width, a second section with the first width, and a third section arranged between the first section and the second section,
wherein the third section of the second interconnect has a second width that is less than the first width.

2. The interconnect structure of claim 1 wherein the third section of the second interconnect defines a fuse link of an electrical fuse.

3. The interconnect structure of claim 2 wherein the first section of the second interconnect defines a first electrode of the electrical fuse, and the first electrode is connected with the fuse link.

4. The interconnect structure of claim 1 wherein the first interconnect and the second interconnect are comprised of copper, aluminum, or cobalt.

5. The interconnect structure of claim 1 wherein the second width is less than or equal to 50 percent of the first width, and the second width is greater than or equal to 25 percent of the first width.

6. The interconnect structure of claim 1 wherein the first interconnect and the second interconnect are contained in the same plane.

7. The interconnect structure of claim 1 further comprising:
an interlayer dielectric layer in which the first interconnect and the second interconnect are embedded, and the second interconnect is spaced from the first interconnect by a line of the interlayer dielectric layer.

8. The interconnect structure of claim 3 wherein the second section of the second interconnect defines a second electrode of the electrical fuse, and the second electrode is connected with the fuse link.

9. The interconnect structure of claim 1 wherein the second width is in a range of five nanometers to ten nanometers.

10. The interconnect structure of claim 6 wherein the first interconnect and the second interconnect have equal thicknesses.

11. The interconnect structure of claim 7 wherein the third section of the second interconnect defines a notch arranged in the second interconnect between the first section of the second interconnect and the second section of the second interconnect, and the line of the interlayer dielectric layer includes a portion arranged in the notch.

* * * * *